United States Patent
Hennessy et al.

(10) Patent No.: US 8,423,103 B2
(45) Date of Patent: Apr. 16, 2013

(54) ENERGY EFFICIENT DATA CENTER

(76) Inventors: Michael J. Hennessy, Ballston Lake, NY (US); Eduard K. Mueller, Ballston Lake, NY (US); Otward M. Mueller, Ballston Lake, NY (US)

( * ) Notice: Subject to any disclaimer, the term of this patent is extended or adjusted under 35 U.S.C. 154(b) by 91 days.

(21) Appl. No.: 13/180,695

(22) Filed: Jul. 12, 2011

(65) Prior Publication Data
US 2013/0017955 A1    Jan. 17, 2013

(51) Int. Cl.
*H01L 39/00*    (2006.01)
(52) U.S. Cl.
USPC ........................................................ 505/163
(58) Field of Classification Search .................. 505/163, 505/701
See application file for complete search history.

(56) References Cited

U.S. PATENT DOCUMENTS

| | | | | |
|---|---|---|---|---|
| 8,301,028 | B2 * | 10/2012 | Davidson et al. | 398/124 |
| 2010/0024445 | A1 * | 2/2010 | Cichanowicz | 62/86 |
| 2011/0286748 | A1 * | 11/2011 | Davidson et al. | 398/118 |

* cited by examiner

*Primary Examiner* — Colleen Dunn
(74) *Attorney, Agent, or Firm* — Leonard Cooper (57) ABSTRACT

An energy efficient data center incorporating superconducting power transmission cables coupled with cryogenically cooled semiconductor inverters and converters, used to supply power to cryogenically operated or room-temperature computers and servers. Other options and features include a lighting system whose performance is enhanced by the cold temperatures, fiber optic connections operated at cryogenic temperatures, integrated renewable energy power sources, advanced energy storage technologies, cryogenically operated computers, and a number of other cryogenic hardware. The operating temperature of the cryogenic components can be anywhere in the range between 0 K and 200 K, with other components operating above 200 K.

20 Claims, 5 Drawing Sheets

ENERGY EFFICIENT DATA CENTER

BACKGROUND OF THE INVENTION

Figure 1:
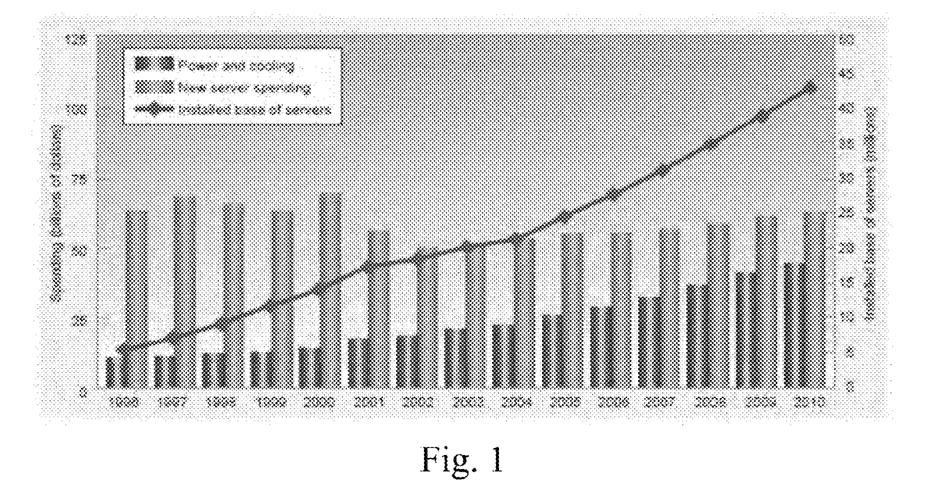
FIG. 1 shows the cost of powering and cooling servers is rapidly approaching that spent in purchasing and installing new servers [4].
Figure 2:
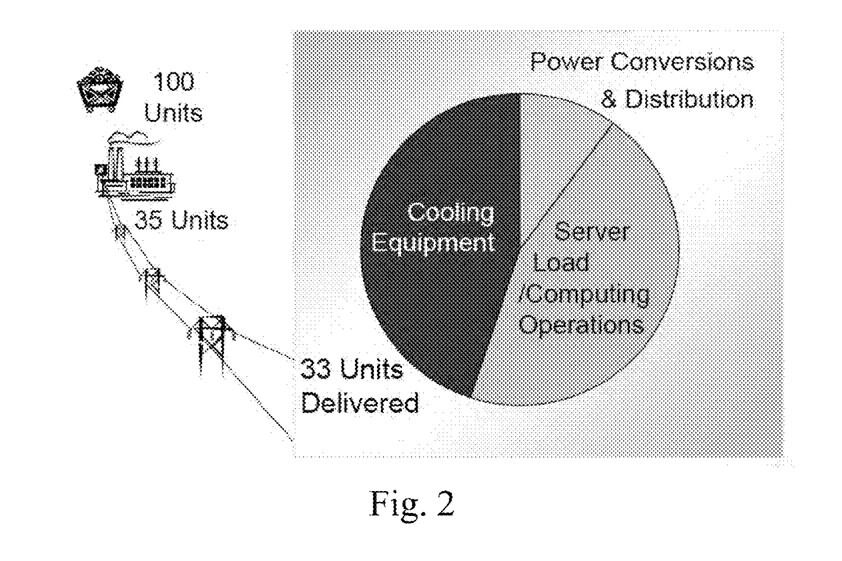
FIG. 2 shows the distribution of energy consumption in a typical data center, with the majority going to the servers, but with energy expended in cooling close behind. When the power conversion and distribution equipment is added to the cooling equipment, the energy consumed by hardware other than computers and servers is greater than 50% of the total [2].
Figure 3:
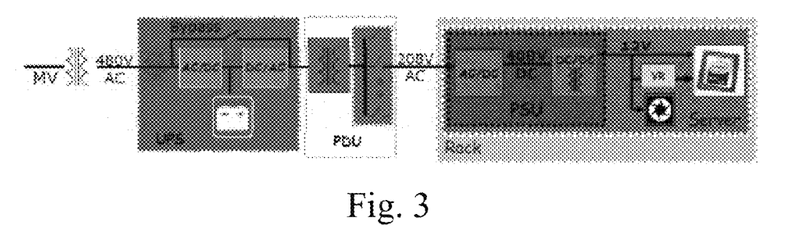
FIG. 3 shows a conventional 460 VAC data center power system [5].

Electricity and energy consumption in data centers is growing at a rapid rate of 12%, based on trends in the industry as of 2006 [1]. This figure includes air conditioning and conventional cooling (i.e., not cryogenic cooling), and in 2006 represented about 1.5% (or about 61 billion kWh) of the electricity used in the U.S. retail sector. An average internet data center consumes about 1-2 kW of power per square meter, with a total capacity of 10-50 MW being installed in new data centers. DC power transmission has the potential for minimizing conversion losses (mainly by reducing reactive power), yielding energy savings of about ~7-10% [2]. In conventional cooling schemes, every watt of reduction in energy consumption leads to an additional reduction of 0.6 to 2 watts of cooling power. FIG. 1 shows that the cost of powering and cooling servers is rapidly approaching that spent in purchasing and installing new servers [4]. FIG. 2 shows the distribution of energy consumption in a typical data center, with the majority going to the servers, but closely followed by the cooling costs [2]. Including the power conversion and distribution equipment, the energy consumed by equipment other than computers and servers is greater than 50% of the total. FIG. 3 shows a typical data center power structure.

Operating computers and computer chips at cryogenic temperatures, especially at 77 K, has been shown to improve computing speed and to reduce certain losses [3, 6-11]. Much work was done in the early 1990's in this field. Because of the costs of cooling an individual computer, most of this work has ceased. By the time a computer was adapted for cryogenic operation, a newer and more powerful computer, which outperformed even the cryogenically cooled one, became available on the market. However, it has been reported that Moore's Law, which states that the number of transistors that can be placed on a computer chip doubles every two years [12], is reaching limits in both economic and technical viability, and may be obsolete within 5-20 years [13,14]. This is verified by the prevalence of parallel and multi-core processors in today's servers and computers. Thus, cryogenically cooled computers may re-emerge as the fastest and most reliable in time. Cryogenic cooling of computers may also lead to reduced power consumption.

Figure 4:
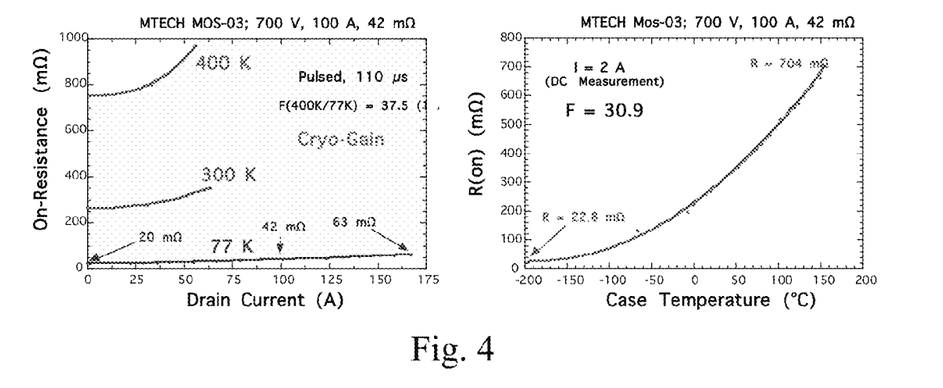
FIG. 4 shows the cryogenic performance of the CryoCircuits MOS-03 MOSFET, developed and tested by MTECH. The on-state resistance of this device drops by a factor of 15 to 30 compared to 300K and 400K operation, respectively.

MTECH Labs is a pioneer in the field of Cryogenic Power Conversion (CPC) [19-44]. The key to CPC is the fact that the loss-producing on-resistance or on-state voltage of high-voltage power MOSFETs decreases by a factor of 14 to 35 through cryo-cooling, as shown by MTECH's measurements of FIG. 4. The physics behind this effect is the drastic increase at low temperatures of the majority carrier electron mobility in the drain-drift region of a high-voltage power MOSFET. Other parameters that improve at low temperatures include switching speed, lifetime and reliability (provided the devices are kept cold), and current-carrying capability.

For these reasons, cryogenic DC-DC converters may outperform conventional ones, especially in efficiency, even when the cooling penalty is included. MTECH has also found that replacing conventional transformers with cryogenic inverters would lead to higher efficiencies. As an example, a typical commercial building power system was examined. Conventional transformers consist of either copper or aluminum windings and a permeable iron core. They are rated by temperature rise above the ambient, with typical values of 80° C., 115° C., or 150° C. A study performed by the Cadmus Group, Inc. and funded by the Northeast Energy Efficiency Partnerships, Inc. in 1999 demonstrated that the average load of a transformer in a building was 15% of the rated nameplate capacity [15]. The study looked at various types of buildings, including universities, manufacturing facilities, and office buildings. This study found that a 14-17% average load was fairly consistent across all types of buildings.

Figure 5:
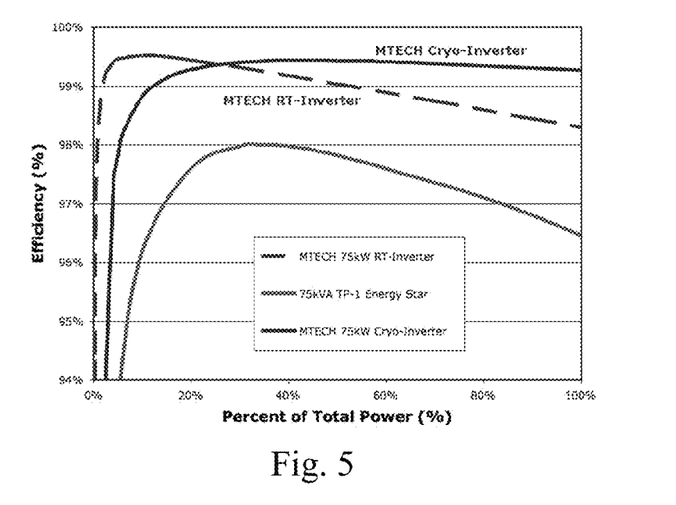
FIG. 5: Efficiency versus load for an Energy Star representative 75-kVA transformer model; taken from a 1999 study by the Cadmus Group, Inc. [15, p.viii; graph re-created]. Also included on the graph is the projected efficiency of MTECH's 75-kW cryogenic inverter and a similar MTECH inverter operating at room temperature. Note that due to the lack of magnetization losses in the inverter, the device's efficiency continues to increase at low powers. These preliminary efficiency calculations include refrigeration losses (10 W/W) to keep the inverters cold.

FIG. 5 includes data taken from the same study and shows that the best 75-kVA transformers (as of 1999) have efficiencies of 98% at optimal loads (about 35% of the nameplate capacity). However, this drops to about 97% efficiency at 15% of the nameplate capacity (and is much lower for other, less efficient types of standard transformers). FIG. 5 also includes the projected efficiency of MTECH's cryogenic inverters (based on a preliminary design and model). These inverters are semiconductor-based devices intended for integration with DC high-temperature superconducting (HTS) cables. Since the cryo-inverters are based on switches, and do not exhibit the magnetization losses encountered in transformers at low power levels, the efficiencies of these devices increase as the power level decreases. Conventional transformers, on the other hand, require a magnetization current which generates non-negligible core losses even for zero-load conditions. In other words, their efficiency falls drastically at low loads.

Note that the transformer core losses are 300-800 W, power these devices dissipate even in open-circuit conditions under no load. Note also that the loss calculations of MTECH's cryogenic inverter include refrigeration losses of 10 W/W— that is, 10 watts of power are required for a refrigerator to remove 1 watt of power at 77 K, which corresponds to just under 30% of the ideal Carnot efficiency, an attainable number with today's refrigeration technologies.

Assuming a building with 1 MW of power installed, the average power being handled by the transformers as a whole would be about 150 kW (15%). Further assuming that the building is equipped with conventional transformers having an efficiency of about 97% at 15% of nameplate capacity, the losses would then be 4.5 kW. Replacing these bulky and heavy copper/iron transformers with cryogenic inverters operating at an efficiency of 99% or higher at this power level, the losses would be reduced by a factor of three to 1.5 kW. The yearly savings for one such building would be 26,280 kWh (including refrigeration losses). It is especially important to note that these cryogenic inverters have no magnetization losses, as do transformers, and therefore do not exhibit standby losses.

Savings in transmission losses throughout the building are equally as important. Assuming line losses of about 5% (consisting mainly of $I^2R$ Joule heating losses and skin effect losses), these would amount to 7.5 kW. By converting the electrical power to DC before transmission and utilizing superconducting cables throughout the building, both the resistive and the skin-effect losses are reduced to almost nothing. This translates into yearly savings of 65,700 kWh. Assuming (conservatively) that the refrigeration losses reduce this by as much as 50% (including the refrigerator inefficiency and heat loads from insulation losses and transitional losses that occur in going from the ambient environment to the cryogenic one, and vice-versa), these savings would still equal 32,850 kWh of energy per year.

Therefore, the total energy savings could be as high as 59,130 kWh for this example of a typical commercial high-rise building. This is the equivalent of saving nearly 30 tonnes (29,565 kg) of coal from being burned every year (per building), thereby keeping more than 54 tonnes of $CO_2$ from polluting the atmosphere.

DESCRIPTION OF THE INVENTION

Described is an energy efficient data center based on the technologies described above. The proposed cryogenic data center, shown in FIGS. 6 and 7, integrates superconducting transmission lines (HTS, LTS, or a combination of the two), cryogenically cooled power conversion equipment (cryogenic power inverters and converters), and cryogenically cooled computers into a single structure. Power is obtained either from the national power grid or from one or more other energy sources, including renewable and environmentally friendly energy systems such as those based on photovoltaic cells (solar power), wind power, biofuels, hydroelectric power, tidal power, fuel cells, clean natural gas, and others. Excess power generated by these renewable and clean energy sources may be placed back onto the grid. The data center incorporates a common bus structure that integrates power from several power sources used in tandem. The data center may be built around cryogenically cooled computers (e.g., servers), or these could be operated at conventional temperatures with only the power distribution and conversion system cooled. Power conditioning is achieved using cryogenically cooled inverters and converters, which transform AC and DC power of given voltages and currents into AC or DC power of different voltage and current at higher efficiencies than are possible with conventional power conversion equipment. Superconducting transmission lines within the data center carry either DC or AC power among cryogenic computers, cryogenic power conditioning equipment, and energy storage systems. The transmission line cables can also supply a cryogenic fluid or gas to the other components in the system (i.e., computers and power conversion equipment). Note that DC cables permit the transmission of twice the power for the same voltage ratings. Of particular importance in this application is that only relatively short lengths of superconducting cables are required for the concept, and that these can carry DC rather than AC power. The energy storage means can comprise of a combination of several conventional energy storage technologies or advanced energy storage means, including superconducting magnetic energy storage (SMES), flywheels, advanced batteries, super-capacitors, and so on. The energy storage systems may also include cryogenically cooled capacitors [16]. Superconducting transmission lines can also be used to transmit data among computers and servers, as well as for high-performance interconnections among computer chips.

The data center may also incorporate superconducting fault current limiters, superconducting transformers, superconducting inductors, superconducting coils, or superconducting generators. Superconducting motors or cryogenically operated piezoelectric motors can be used for hard drives, robotics, or other purposes. Devices based on superconducting Josephson junctions can also be included, as can quantum computers.

Maintenance can be facilitated using detachable superconducting leads, which allow for sections of equipment to be disconnected from the cryogenic environment and warmed up independently. This would allow repair or replacement of components without disabling the entire cryogenic data center. Such leads are currently being developed by the inventors at MTECH Labs.

Figure 8:
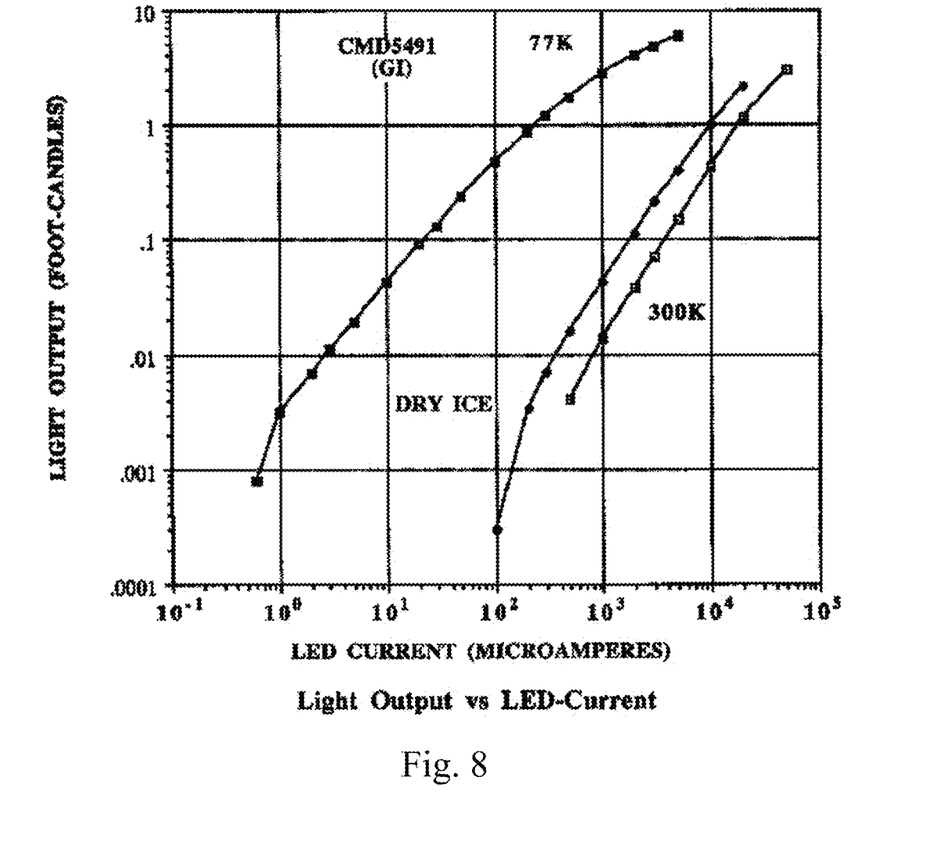
FIG. 8 shows the decrease in forward diode current with decreasing temperature in a light emitting diode for a given light output.

The cryogenically cooled computers and power conditioning equipment may also include cryogenically cooled fiber optic transmitters and receivers, as well as light-emitting diode-based displays. Fiber optics can be used to transmit signals from cryogenic to room-temperature environments with reduced heat load. Cryogenically cooled light emitting diodes can also be used for more efficient light generation, as shown in FIG. 8. Network switches and routers could also be operated at cryogenic temperatures for improved performance (especially at the system level), or simply for easier integration with other cryogenic components. Few conventional devices work as-built at low temperatures, and most of these would have to be specially designed. For example, electrolytic capacitors would have to be replaced with ones containing polymer films, ceramics, or other cryogenically compatible dielectrics, and some transistors would have to be replaced with cryogenically qualified semiconductor technologies. Packaging is also an important consideration, as many materials crack at cryogenic temperatures.

Cryogenic cooling equipment may comprise of cryo-coolers, or convection- or conduction-based cooling systems utilizing liquid nitrogen, liquid helium, or cold gaseous nitrogen or helium. Any gaseous or liquid cryogen could be used. A centralized cooling system may be most efficient. A liquid nitrogen generation plant could be included on-site, and liquid nitrogen generation could be achieved mainly in off-peak hours in order to shed the power consumption load.

PREFERRED EMBODIMENT

Figure 6:
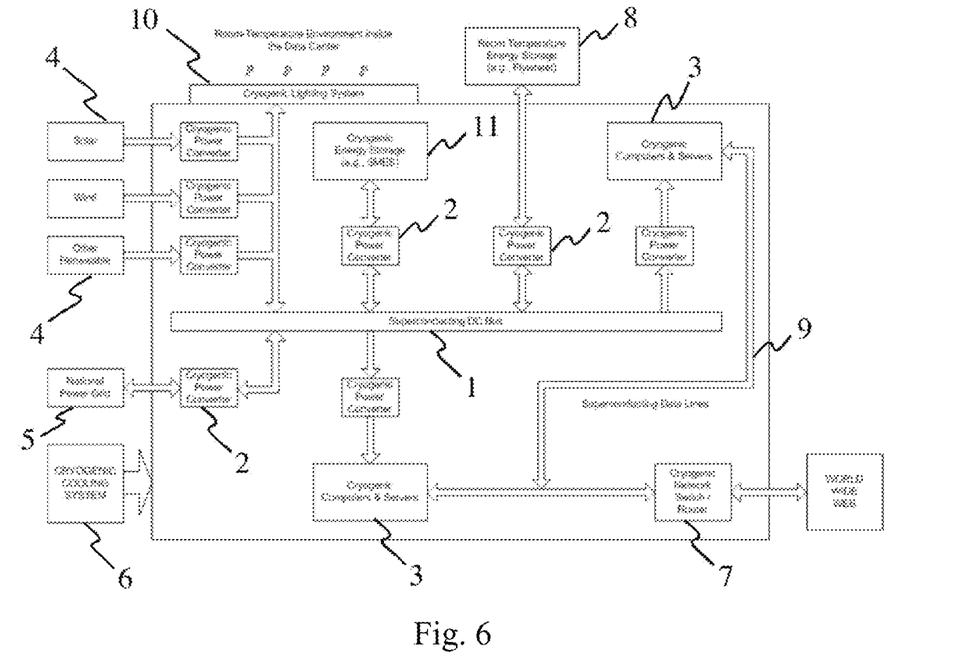
FIG. 6 illustrates the cryogenic data center concept (in one embodiment).
Figure 7:
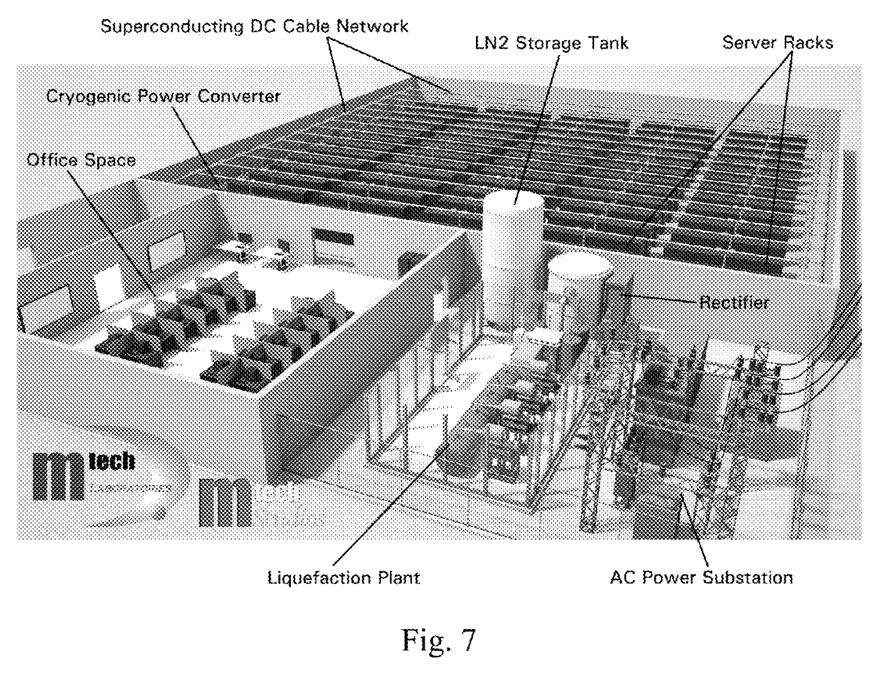
FIG. 7 illustrates a possible implementation of the cryogenic data center concept.

The preferred embodiment of the cryogenic data center, shown in FIG. 6, consists of a network or superconducting power busses 1, with DC current supplied to it from either a power generation source 4 or the national power grid 5 (in which case it would include an additional transformer to isolate power in the cryogenic data center from said national grid), wherein said power is converted, if necessary, from AC to DC or from DC of one voltage level to DC power of another voltage level through a plurality of cryogenically operated AC/DC inverters and/or DC/DC converters 2 as required to optimize efficiency in the system. The DC current in the superconducting power bus network 1 is then converter again to the required voltage, current, and current type (AC or DC) via another set of cryogenically operated AC/DC or DC/DC converters 2 for delivery to the load, which may include a plurality of cryogenically operated computers and servers 3, a lighting system 10, and cryogenic network switches and routers 7. These loads may also be operated at conventional temperatures, in which case cryogenic leads would be required to transition current from the cryogenic environment to the room-temperature environment. The data center may also include a network of superconducting data transmission lines 9 to interconnect said plurality of cryogenic computers and servers 3. The cryogenic cooling system 6 may consist of a single, centralized cryo-cooler or tank of liquid nitrogen, or a plurality of distributed cryo-coolers of cryogenic storage tanks. Cryogenic fluids and gases can be delivered to any cryogenic loads through the cable cryostats associated with the superconducting DC bus network 1. Energy storage can be achieved using cryogenically operated devices 11, such as SMES units, or room-temperature devices 8 such as flywheels, or preferably a combination of both.

PRIOR ART

In a report generated for Congress, the U.S. EPA identified a number of ways in which the efficiencies of data centers could be greatly improved [1]. While superconducting cables were briefly touched upon, the cryogenic operation of computers and inverters was not suggested. Others have proposed utilizing superconducting DC buses for use in data centers, including Joseph Minervini's group at the MIT Plasma Science and Fusion Center [2]. This group does advance the possibility of integration with renewable energy sources such as solar and wind, as well as integration with advanced energy storage technologies such as superconducting magnetic energy storage and flywheels. However, they do not propose operating the computers or computer chips at cryogenic temperatures, nor do they include cryogenic power conversion. This integration is the main innovation of the proposed concept.

Much work has also been done in the past in adapting and developing computers and computer chips to operate at cryogenic temperatures, especially 77 K [3, 6-11]. However, most previous work focused on improvements in computer performance at low temperatures, and not on integration of these devices in large numbers with superconducting components and cryogenic power conversion equipment. Also, because of the high cost of cooling an individual computer, most of this work has ceased. The proposed data center could use a common cryogenic platform to cool multiple components, including superconducting transmission lines, computers, power generation equipment, and lighting systems.

DETAILED DESCRIPTION OF THE DRAWINGS

REFERENCES (NON PATENT LITERATURE)

[1] U.S. EPA, "Report to Congress on Server and Data Center Energy Efficiency," Aug. 2, 2007, available online at http://www.energystar.gov/ia/partners/prod_development/downloads/EPA_Datacenter_Report_Congress_Final1.pdf

[2] J. V. Minervini, L. Bromberg, M. Takayasu, C. Miles and N. R. LaBounty, "HTS DC Cables for Power Distribution in Data Centers," *Workshop on Superconducting DC Transmission and Distribution*, MIT Plasma Science and Fusion Center, Cambridge, Mass., Feb. 25, 2009.

[3] S. Wainner and R. Richmond, *The Book of Overclocking: Tweak Your PC to Unleash Its Power*, No Starch Press (2003).

[4] G. Lawton, "Powering Down the Computing Infrastructure," *Computer, IEEE*, 40, issue 2, p 16-19, February 2007.

[5] Pratt, A., P. Kumar, and T. V. Aldridge. Evaluation of 400V DC Distribution in Telco and Data Centers to Improve Energy Efficiency," *29th IEEE INTELEC 2007*, 2007, Rome, Italy

[6] http://www.metacafe.com/watch/254200/automated_liquid_nitrogen_computer_case/

[7] http://www.tomshardware.com/reviews/5-ghz-project, 731.html

[8] http://speedingcomputer.com/2007/12/the-liquid-nitrogen-cooled-computer/

[9] D. T. Vader and V. C. Vasile, "High performance thermal interface for low temperature electronic modules," U.S. Pat. No. 5,463,872, Issued Nov. 7, 1995

[10] H. Yamamoto, "Multichip module packaging for cryogenic computers," *Circuits and Systems, 1991., IEEE International Symposium on*, 11-14 Jun. 1991 Page(s): 2296-2299 vol. 4

[11] S. Novotny, "Performance evaluation of a Gifford-McMahon refrigerator for cryogenically cooled computer applications," *Thermal Phenomena in Electronic Systems, 1990. I-THERM II., InterSociety Conference on*, 23-25 May 1990 Page(s):97-100

[12] http://en.wikipedia.org/wiki/Moore's_law

[13] http://news.cnet.com/2100-1008-5112061.html

[14] http://www.hpcwire.com/blogs/The-End-of-Moores-Law-in-Five-Years-48287682.html

[15] The Cadmus Group, Inc., "Metered load factors for low-voltage, dry-type transformers in commercial, industrial, and public buildings," a study funded by the Northeast Energy Efficiency Partnerships, Inc. (NEEP), Dec. 7, 1999; (This report can be found online at http://www.ceel.org/ind/trnsfin/neep-rpt.pdf).

[16] O. M. Mueller, E. K. Mueller, and M. J. Hennessy, "Cryogenic Capacitors", U.S. Pat. No. 7,126,810, Issued Oct. 24, 2006

[17] O. M. Mueller, E. K. Mueller, "The Cryo-LED: Key to Cold Light (?)", 4th European Workshop on Low Temperature Electronics, ESTEC, The Netherlands, June 2000, pp. 123-129

[18] R. Singh and B. J. Baliga, Cryogenic Operation of Silicon Power Devices, Kluwer Academic Publishers, Boston, 1998

[19] O. Mueller, "Cryogenic Power Distribution System for Large Structures", U.S. Pat. No. 6,545,880 B1, Issued Apr. 8, 2003

[20] O. Mueller and E. K. Mueller, "Cryogenic Power/Energy Distribution System," Paper CPC-1, CEC-ICMC-99, Jul. 12-16, 1999, Montreal, Quebec, Canada

[21] O. M. Mueller, E. K. Mueller, "Analysis of the HTS-Cable/Cryo-Silicon Transformer System", Applied Superconductivity Conference, Virginia Beach, Va., September 2000

[22] O. M. Mueller, E. K. Mueller, "Efficient Two-Level Cryogenic Power Distribution System", Cryogenic Engineering Conference/International Cryogenic Materials Conference, Madison, Wis., July 2001

[23] E. K. Mueller, O. Mueller, and M. J. Hennessy, "Performance of High-Voltage IGBTs at Cryogenic Tempera-

[24] O. Mueller, "Cryogenic MOSFET power conversion—Is it feasible?" Proceedings of the GE-GOSAM Hybrid & Packaging and ADC Electronics Panel Meeting, Sagamore Resort and Conference Center, Bolton Landing, N.Y., Apr. 11-13, 1989

[25] O. Mueller, "Cryogenic MOSFET power conversion," Proceedings of the IEEE Workshop on Low Temperature Semiconductor Electronics, pp. 94-98, University of Vermont, Aug. 7 & 8, 1989 (IEEE 89TH0252-7)

[26] M. J. Hennessy, E. K. Mueller, O. M. Mueller, J. N. Park, and R. R. Neal, "Cryogenic Power Converter Module Performance", CEC-ICMC-2005, August/September 2005

[27] O. Mueller, "On-resistance, thermal resistance, and reverse recovery time of power MOSFETs at 77 K," Cryogenics, Vol. 29, pp. 1006-1014, October 1989

[28] O. Mueller, "The cryogenic power MOSFET," Proceedings of the 20th International Power Conversion Conference, München, Germany, Jun. 25-29, 1990 (Also GE CRD Report 90CRD206)

[29] O. Mueller, "Cryogenic power conversion: Combining superconducting and semiconducting devices," American Institute of Physics, "Superconductivity and its Applications," vol. 251, pp. 746-760, March 1992

[30] O. Mueller, "Properties of High-Power Cryo-MOSFETs," Conference Record of the 1996 Annual IEEE Industrial Applications Society Meeting (IAS-96), vol. 3, pp. 1443-1448 (IEEE 96CH35977), San Diego, Calif., October 1996.

[31] J. Hudgins, C. Godbold, W. Portnoy, and O. Mueller, "Temperature Effects on GTO Characteristics," IEEE IAS-94 Conference Record, pp. 1182-1186, 1994

[32] E. K. Mueller, O. M. Mueller, "High-Speed Cryo-CMOS Driver Circuits for Power Inverters", Cryogenic Engineering Conference/International Cryogenic Materials Conference, Montreal, Quebec, Canada, June 1999, Paper CPC-2

[33] R. J. Thome, E. Bowles, M. J. Hennessy, E. K. Mueller, M. J. Gouge, and S. Wolfe, "Power Conversion System Benefits of Reduced Temperature Operation", EMTS-2004

[34] P. Haldar, H. Ye, H. Efstathiadis, J. Raynolds, M. J. Hennessy, O. Mueller, and E. K. Mueller, "Improving Performance of Cryogenic Power Electronics", Applied Superconductivity Conference 2004, Paper 3LC02, 2004 or IEEE Transactions on Applied Superconductivity, Vol. 15, Issue 2, Part 2; June 2005; pp. 2370-2375

[35] R. R. Ward, W. J. Dawson, L. Zhu, R. K. Kirschman, G. Niu, R. M. Nelms, O. Mueller, M. J. Hennessy, E. K. Mueller, "Novel SiGe Semiconductor Devices for Cryogenic Power Electronics", CEC-ICMC-2005, August/September 2005

[36] R. R. Ward, W. J. Dawson, L. Zhu, R. K. Kirschman, G. Niu, R. M. Nelms, O. Mueller, M. J. Hennessy, E. K. Mueller, R. L. Patterson, J. E. Dickman, and A. Hammoud, "SiGe Semiconductor Devices for Cryogenic Power Electronics—III", IMAPS Advanced Technology Workshop (ATW) on Reliability of Advanced Electronic Packages and Devices in Extreme Cold Environments, February 2005

[37] E. K. Mueller, M. J. Hennessy, O. M. Mueller, R. R. Neal, and A. E. Libby, "Low-Temperature Capacitors for Cryogenic Power Electronics Systems", CEC-ICMC-2005, August/September 2005

[38] P. Haldar, H. Ye, H. Efstathiadis, J. Raynolds, M. J. Hennessy, O. M. Mueller, and E. K. Mueller, "Improving Performance of Cryogenic Power Electronics", Applied Superconductivity, IEEE Transactions on, Vol. 15, Issue 2, Part 2, pp. 2370-2375, 2005

[39] R. R. Ward, W. J. Dawson, L. Zhu, R. K. Kirschman, G. Niu, R. M. Nelms, O. Mueller, M. J. Hennessy, E. K. Mueller, R. L. Patterson, J. E. Dickman and A. Hammoud, "SiGe and Ge Cryogenic Power Transistors", ECS 2006, Electrochemical Society SiGe Symposium, 2006

[40] R. R. Ward, W. J. Dawson, L. Zhu, R. K. Kirschman, G. Niu, R. M. Nelms, O. Mueller, E. K. Mueller, M. J. Hennessy, R. L. Patterson, J. E. Dickman and A. Hammoud, "SiGe Semiconductor Devices for Cryogenic Power Electronics—V", 7th European Workshop on Low Temperature Electronics, (WOLTE-7), ESTEC, The Netherlands, Jun. 21-23, 2006

[41] E. K. Mueller, M. J. Hennessy, O. Mueller, R. R. Neal, A. E. Libby, P. J. Steffan, and W. J. Wilson, "Reliability of Cryogenic Power Electronics Components", Presented at NASA IMAPS 2007, Feb. 26-28, 2007

[42] O. M. Mueller, E. K. Mueller, and M. J. Hennessy, "Efficient thyristor-type power switches", U.S. Pat. No. 7,352,233, Issued Apr. 1, 2008

[43] M. J. Hennessy, J. N. Park, O. M. Mueller, and E. K. Mueller, "Snubbers for low temperature power electronics", U.S. Pat. No. 7,369,377, Issued May 6, 2008

[44] M. J. Hennessy and E. K. Mueller, "Hybrid switch", U.S. Pat. No. 7,391,133, Issued Jun. 24, 2008

The invention claimed is:

1. A data center comprising of an integration of the following:
   a. Superconducting transmission lines;
   b. Cryogenically operated power conversion devices;
   c. Electronic devices operated at cryogenic temperatures (0 K to 200 K);
   d. Computers;
   e. Energy storage means;
   f. At least one power source;
   g. A light source; and
   h. Means for achieving and maintaining cryogenic temperatures.

2. The data center of claim (1) in which said electronic devices operated at cryogenic temperatures include computers, servers, network switches, memory devices, solid-state and other types of hard drives, and routers, and in which said cryogenically operated computers are cooled to enhance at least one of efficiency and clock speed.

3. The data center of claim (1) in which said power sources include at least one of renewable and clean energy sources, including (but not limited to) solar, wind, biofuels, fuel cells, hydroelectric power, tidal power, fuel cells, nuclear power, clean natural gas, and methane, and where each of said renewable and clean energy sources is integrated into said data system via a common, central power bus structure.

4. The data center of claim (1) in which said energy storage means consists is chosen from the group that includes at least one of flywheels, superconducting magnetic energy storage, batteries, capacitors, ultracapacitors, and superconducting capacitors.

5. The data center of claim (1) in which said electronic devices operated at cryogenic temperatures include any device whose performance is enhanced at cryogenic temperatures, for instance through faster speeds and lower power dissipation, but where said electronic devices operated at cryogenic temperatures may also contain components that are operated at a higher temperature, including room temperature.

6. The data center of claim (1) in which said electronic devices operated at cryogenic temperatures incorporate cryogenically cooled components chosen from the group that includes MOSFETs, IGBTs, IGCTs, diodes, GTOs, triacs, SCRs, CMOS devices, capacitors, resistors, inductors, flash memory devices, hard drives, solid-state drives.

7. The data center of claim (1) in which said electronic devices operated at cryogenic temperatures include at least one of inverters that convert AC power to DC power, devices that convert DC power at one voltage and current to DC power at another voltage and current, and devices that convert AC power at one voltage and current to AC power at another voltage and current.

8. The data center of claim (1) in which said superconducting transmission lines include power transmission lines, where said superconducting buswork is used to distribute power to and from said power source, said energy storage means, and said electronic devices operated at cryogenic temperatures.

9. The data center of claim (1) in which said superconducting transmission lines include superconducting data lines and chip-to-chip interconnects used to carry digital or analog data among various of said electronic devices operated at cryogenic temperatures, as well as among other devices in said data center.

10. The data center of claim (1) in which said computers are connected to one another via fiber optic data lines.

11. The data center of claim (1) in which said electronic devices operated at cryogenic temperatures incorporate devices based on one of silicon-germanium, germanium, silicon, gallium arsenide, silicon carbide, gallium nitride, and other suitable semiconducting materials.

12. The data center of claim (1) in which said electronic devices operated at cryogenic temperatures include at least one of fiber optic transmitters, fiber optic receivers, and low-noise preamplifiers for use as hard drive sensors, and fiber-optically transmitted light-emitting diode data displays.

13. The data center of claim (1) in which said light source comprises light emitting diodes cooled to a cryogenic or intermediate temperature through means that include a heat exchanger, boil-off gas convection, and other means for enhanced light output and improved conversion efficiency, and in which said light source can be operated any voltage level (AC as well as DC), including low DC voltage such as one chosen from the group of 5 VDC, 12 VDC, 24 VDC, and 48 VDC.

14. The data center of claim (1) in which said means for achieving and maintaining cryogenic temperatures consist of one of conduction and convection methods utilizing at least one of a cryogenic refrigerator and a suitable cryogen chosen from the group of (but not limited to) liquid nitrogen, liquid helium, cold gaseous nitrogen, and cold gaseous helium, and in which redundant cryogenic systems are included for reliability, including (but not limited to) means of storing a cryogen for use as a backup cooling source is included in case the refrigeration system becomes inoperable for any reason, including failure and routine maintenance.

15. The data center of claim (1) in which said electronic devices operated at cryogenic temperatures include at least one of Josephson junctions, computers involving superconducting components, and quantum computers.

16. The data center of claim (1), which incorporates at least one of superconducting fault current limiters, superconducting transformers, superconducting inductors, superconducting coils, superconducting generators, superconducting motors for hard drives, robotics, and other purposes, and cryogenically operated piezoelectric motors for hard drives, robotics, and other purposes.

17. The data center of claim (1) providing sufficient access for upgrading and servicing all the equipment installed therein, including detachable superconducting leads that can be used to perform maintenance on components at room temperature without warming the entire system.

18. The data center of claim (1), in which power obtained from said renewable and clean energy sources can be placed on to the national power grid in times where consumption within said data center is lower than the production from said renewable or clean energy sources.

19. The data center of claim (1), in which power can be obtained from the national power grid, especially in times in which power consumption within said data center is higher than the production from said renewable or clean energy sources.

20. The data center of claim (1), in which said renewable and clean energy sources is generated at sufficiently low voltages (chosen from the group that includes but is not limited to 48 VDC, 12 VDC, and 5 VDC) to be used directly by the computing load without conversion from higher voltages (such as 400 VDC).

\* \* \* \* \*